(12) United States Patent
Tang et al.

(10) Patent No.: US 7,846,807 B2
(45) Date of Patent: Dec. 7, 2010

(54) METHOD FOR FORMING MEMRISTOR MATERIAL AND ELECTRODE STRUCTURE WITH MEMRISTANCE

(75) Inventors: Daniel Tang, Fremont, CA (US); Hong Xiao, Pleasanton, CA (US)

(73) Assignee: Hermes-Epitek Corp., Taipei (TW)

( * ) Notice: Subject to any disclaimer, the term of this patent is extended or adjusted under 35 U.S.C. 154(b) by 35 days.

(21) Appl. No.: 12/486,403

(22) Filed: Jun. 17, 2009

(65) Prior Publication Data

US 2009/0317958 A1 Dec. 24, 2009

Related U.S. Application Data

(60) Provisional application No. 61/073,799, filed on Jun. 19, 2008.

(51) Int. Cl.
*H01L 27/115* (2006.01)
(52) U.S. Cl. .............................. 438/385; 257/E21.006; 257/E21.662
(58) Field of Classification Search .......... 257/E21.006, 257/E21.662; 438/385, FOR. 429
See application file for complete search history.

(56) References Cited

U.S. PATENT DOCUMENTS

| 4,861,750 | A * | 8/1989 | Nogawa et al. ............. 505/473 |
| 7,456,076 | B2 * | 11/2008 | Menon et al. ................ 438/385 |
| 7,615,459 | B1 * | 11/2009 | Inoue et al. .................. 438/385 |
| 2002/0061604 | A1 * | 5/2002 | Sitaram et al. .................. 438/3 |
| 2009/0317958 | A1 * | 12/2009 | Tang et al. ................... 438/384 |
| 2010/0155720 | A1 * | 6/2010 | Kaneko ....................... 257/43 |

* cited by examiner

*Primary Examiner*—George Fourson
(74) *Attorney, Agent, or Firm*—Muncy, Geissler, Olds & Lowe, PLLC

(57) ABSTRACT

Ion Implantation is used to form the memristor material and electrode structure with memristance. First, numerous electron-rich element atoms are implanted into a layer made of transition metal or non-metal. Then, a treating process (such as annealing) is proceeded to expel some electron-rich element atoms away the layer. After that, some electron-rich element vacancy rich regions are formed inside the layer, and then a memristor material is formed. Significantly, the usage of ion implantation can precisely control and flexibly adjust the distribution of the implanted atoms, and then both the amount and distribution of these depleted regions can be effectively adjusted. Hence, the quality of the memristor material is improved.

20 Claims, 8 Drawing Sheets

METHOD FOR FORMING MEMRISTOR MATERIAL AND ELECTRODE STRUCTURE WITH MEMRISTANCE

CROSS REFERENCE TO RELATED APPLICATIONS

This application claims priority of U.S. Provisional Application No. 61/073,799 filed on Jun. 19, 2008 under 35 U.S.C. §119(e), the entire contents of which are hereby incorporated by reference.

BACKGROUND OF THE INVENTION

1. Field of the Invention

The present invention generally relates to formation of memristor material, and more particularly to formation of both memristor material and electrode structure with memristance by using ion implantation.

2. Description of the Prior Art

Memristors ("memory resistors") are a class of passive two-terminal circuit elements that maintain a functional relationship between the time integrals of current and resistance. Its function, the memristance, is essentially similar to the variable resistance, when a memristor's memristance is a function of charges inside the memristor. However, there is no generic memristor. Indeed, different types of such devices implement some particular functions.

The HP Laboratory announced a type of memristor on Apr. 30, 2008. The memristor presented by HP is composed of a thin titanium dioxide film between two electrodes. Herein, as example, the film is as thin as three nanometers, and the electrodes are a pair of platinum layers. The film includes two layers, wherein one is a non-depleted layer and the other is a depleted layer which has a slight depletion of oxygen. The oxygen vacancies where oxygen atoms would normally act as charge carriers, meaning that the depleted layer has a much lower resistance than the non-depleted layer. When the electrodes apply a current through the thin titanium dioxide film, the oxygen vacancies will be driven so as to let the distribution of the oxygen vacancies change. In other words, the resistance of the film as a whole is dependent on how much charge has been passed through the film in a particular direction, which is reversible by changing the direction of current. Clearly, when all oxygen vacancies drift to an interface between the film and one electrode, the resistance of the film is maximum because there is no charge carrier inside the film.

Note that the key of the variation of the resistance of the memristor is how the distribution of the charge carriers (such as the oxygen vacancies) is changed by the net charges passing through the memristor. Hence, the thin titanium dioxide film is variable. In other words, the film can have two layers or only one layer having oxygen vacancies. Moreover, owing to the similar resistance transition characteristics of the transition metal oxides, the titanium dioxide film can be even replaced by a transition metal oxide (TMO). For example, zinc oxide (ZnO), titanium dioxide (TiO2), niobium oxide (Nb2O5), zirconium dioxide (ZrO2), or nickel oxide (NiO)

Conventional manufacturing methods of the transition metal oxide film include sputtering, evaporation, physical vapor deposition (PVD) process, chemical vapor deposition (CVD) and Sol-Gel. In general, the wafer is placed in a chamber and the components of the transition metal oxide film are directly formed on the surface of the wafer. However, the transition metal oxide film formed by evaporation usually is more porous and has lower density, despite having more oxygen vacancies. The transition metal oxide film formed by sputtering or PVD usually has higher density, but it is easier to be polluted by the used plasma and has less oxygen vacancies. The transition metal oxide film formed by CVD is easier to be polluted by the used precursors. The transition metal oxide film formed by the Sol-Gel usually has lower density and higher porosity. Moreover, all these conventional methods can not precisely and flexibly change the chemical composition of the transition metal oxide film. Besides, all these conventional methods are fine tuned for forming a transition metal oxide film with at least a hundred angstroms thickness, but they are not proper to form a transition metal oxide film with several nanometers thickness.

Clearly, all conventional manufacturing methods are not perfect enough to form a high-quality transition metal oxide film, especially when the required thickness of the transition metal oxide film is only several nanometers. Besides, the amount and the distribution of oxygen vacancies inside the film are hard to be precisely and flexibly adjusted, because these oxygen vacancies are formed with growth the transition metal oxide film. Therefore, the applications of the memristor with transition metal oxide film may be degraded and restricted.

Accordingly, it is desired to develop a new approach to form memristor material with transition metal oxide film, wherein both the amount and the distribution of the oxygen vacancies inside the transition metal oxide film can be effectively and flexibly adjusted.

SUMMARY OF THE INVENTION

Accordingly, the present invention discloses a method for forming both memristor material and electrode structure with memristance by using ion implantation.

The formed memristor material has a basic formulation of MA, wherein M is a transition metal or non-metal, and A is an electron-rich element.

One feature of the present invention is using the implantation to adjust the distribution of oxygen vacancies inside the memristor material film. Herein, as an example, B components can react with electron-rich components inside the film made of transition metal and electron-rich element are implanted into the film, such that the electron-rich element vacancies are formed after some volatile components made of the implanted B components and electron-rich components, i.e. A components, are expelled away from the film.

Another feature of the present invention is forming the film made of transition metal and electron-rich element by implantation. Herein, by adjusting the recipes of the implantation, the distribution of electron-rich components inside the film can be adjusted. Hence, the distribution of electron-rich element vacancies inside the film can be correspondingly adjusted, especially after some volatile components including at least electron-rich elements are expelled away from the film.

For practical examples, in the MA layer, there are numerous A atoms and M atoms. Besides, the implanted B components usually are B atoms and the expelled AB components usually are AB molecules. However, the invention does not limit to the details. For example, the implanted B components can be B ions or compounds with B elements, depends on the recipe of the implantation for implanting B. For example, the expelled AB components can be AB ions, depends on the practical chemical reaction between A and B.

BRIEF DESCRIPTION OF THE DRAWINGS

The accompanying drawings incorporated in and forming a part of the specification illustrate several aspects of the present invention, and together with the description serve to explain the principles of the disclosure. In the drawings.

DETAILED DESCRIPTION OF THE PREFERRED EMBODIMENTS

The present disclosure can be described by the embodiments given below and corresponding drawings. It is understood, however, that both the embodiments below and corresponding drawings are not necessarily limitations to the present disclosure, but are used to a typical implementation of the invention.

The first embodiment of the present invention includes a method for forming a memristor material using ion implantation.

Figure 1A:
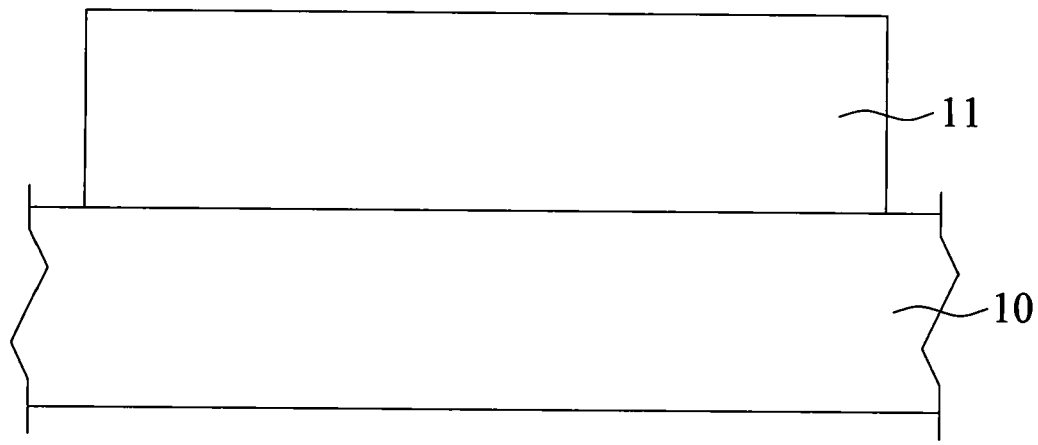
FIG. 1A to FIG. 1E are cross-sectional views illustrating a method for forming an electrode structure with memristance using implantation according to one embodiment.

First, as shown in FIG. 1A, a substrate 10 having a MA layer 11 formed thereon is provided. Herein, A is an electron-rich element which is usually selected from a group consisting of the following: oxygen, sulfur, fluorine, chlorine, bromine, and iodine. Herein, M is an element selected from a group consisting of the following: transition metal and non-metal. Herein, as example, M can be Titanium, Tantalum, Calcium, Nickel, Cerium, Vanadium, Niobium, Tungsten, Zirconium, Indium, Zinc, Tin, Platinum, ruthenium, Iridium, Silver or other transition metal. Hence, the memristor material can be $TiO_2$, $Ta_2O_5$, $TaO_2$, $CaF_2$, NiO, $CeO_2$, $VO_2$, $V_2O_5$, $NbO_2$, $Nb_2O_5$, $TiO_2$, $Ti_2O_3$, $WO_3$, $Ta_2O_5$ and $ZrO_2$, InZnO (IZO), InSnO (ITO), $PtO_2$, $RuO_2$ and IR $O_2$. Herein, the so-called non-metal usually is silicon or carbon. Moreover, how to form the MA layer 11 is not limited by this embodiment. For example, it can be formed by implanting a plurality of A atoms (even A ions or compound made of A and other element) into a M layer formed on substrate 10, or be formed by other well-known methods, such as PVD, CVD, sputtering, and the like.

Figure 1B:
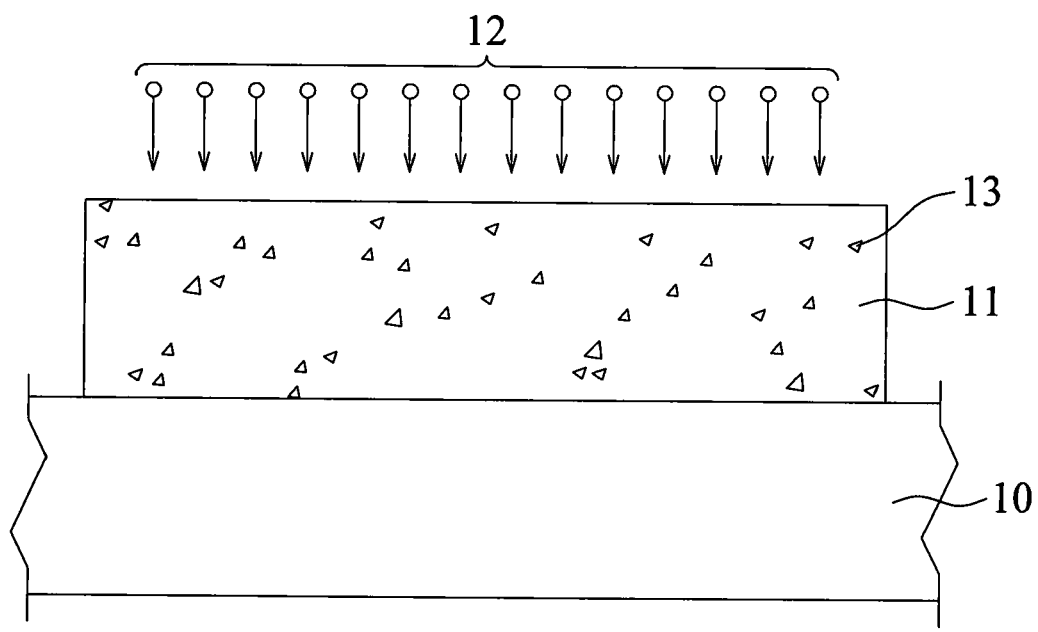

Second, as shown in FIG. 1B, implants numerous B atoms 12 (even B ions or compound made of B and other element) 12 into the MA layer 11, such that numerous AB molecules 13 are formed inside the MA layer 11.

Figure 1C:
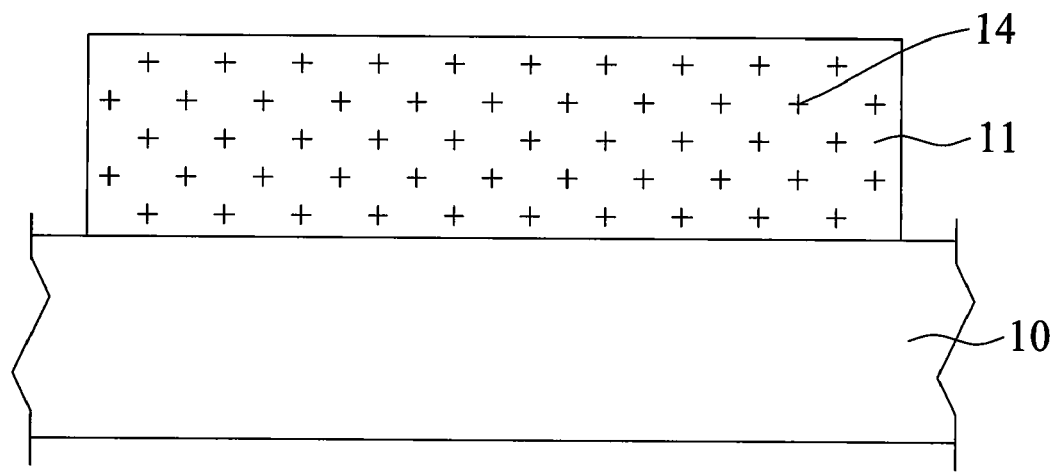

Third, as shown in FIG. 1C, treating the MA layer 11 with these AB molecules 13, such that at least a portion of these AB molecules 13 are expelled away the MA layer 11 and then a plurality of A vacancies 14 are distributed inside the MA layer 11. Herein, FIG. 1C shows the case that all AB molecules 13 being expelled and only A vacancies 14 are located inside the MA layer 11. However, the invention does not limit how many AB molecules 13 are expelled. It is possible that some AB molecules 13 still is located inside the MA layer 11 after the aforementioned treating process.

Note that distribution of AB molecules 13 and vacancies 14 are not limited. Although FIG. 1B and FIG. 1C shows that they are uniformly distributed inside the MA layer 11, it still is possible that AB molecules 13 or A vacancies 14 are distributed only in a portion of the MA layer 11 when the distribution of B atoms 12 are adjusted by adjusting the recipe of the implanting process.

Moreover, the requirement of B selection would be that: the AB molecules 13 can be easily expelled away the MA layer 11, especially can be easily expelled away the MA layer 11 with as small as possible damages on the MA layer 11. Clearly, a preferred solution is that the AB molecule is volatile. Herein, B can be oxygen or hydrogen, because most of AB molecule is volatile. For example, both A and B are oxygen such that the volatile oxygen molecules are formed. Herein, B can be hydrogen, because most of electron-rich elements trends to react with hydrogen and form a volatile molecule. For example, A is oxygen or Fluorine and B is hydrogen, such that the volatile $H_2O$ (vapor) or HF are formed.

Moreover, owing to the requirement is "can be easily expelled away the MA layer 11", it is reasonable the detail of the molecule need not be limited, except A must be a component of the molecule to be expelled. Hence, B can correspond to at least two different elements, such that a volatile compound is formed by the chemical reaction between the electron-rich elements and the two elements. For example, A is sulfur and B corresponds to both hydrogen and oxygen, such that a volatile $H_2SO_4$ is formed. Note that symbol AB only is used to indicate a compound having the elements A and B, it does not limit the real ration between A and B. As the examples shown above, the ratio between A and B is flexible, such as 1 (HF) or ½ ($H_2O$). Moreover, the symbol only is used to indicate a compound having at least the electron-rich element A. Hence, B is a generic term, it can indicate only one element or indicate some elements.

Further, the treating step is selected by the embodiment that: easily expel the AB molecules 13 with minimum damages on the MA layer 11. A popular way is heating the MA layer 11 with AB molecules 13, especially is an anneal process that heat the MA layer 11 for a very short period so as to allow a minimal thermal effect on the MA layer. How to heat the MA layer 11 with AB molecules 13 is not limited, it can be achieved by projecting a light on the MA layer 11 with AB molecules 13, by using a furnace to heat the substrate 10 with MA layer 11 having AB molecules 13, or by delivering a hot gas (such as heat nitrogen gas) to cover and heat the MA layer 11 having AB molecules 13.

Note that the above treating step also can be used to accelerate or induce the chemical reaction between A and B. In such situation, the steps shown in FIG. 1B and FIG. 1C should be replaced by FIG. 1D and FIG. 1E in sequence. Herein, FIG. 1D shows that numerous B atoms 12 are implanted into the MA layer 11, and FIG. 1E shows that numerous A vacancies 14 are formed inside the MA layer 11 after numerous AB molecules 13 are formed and expelled.

Figure 1D:
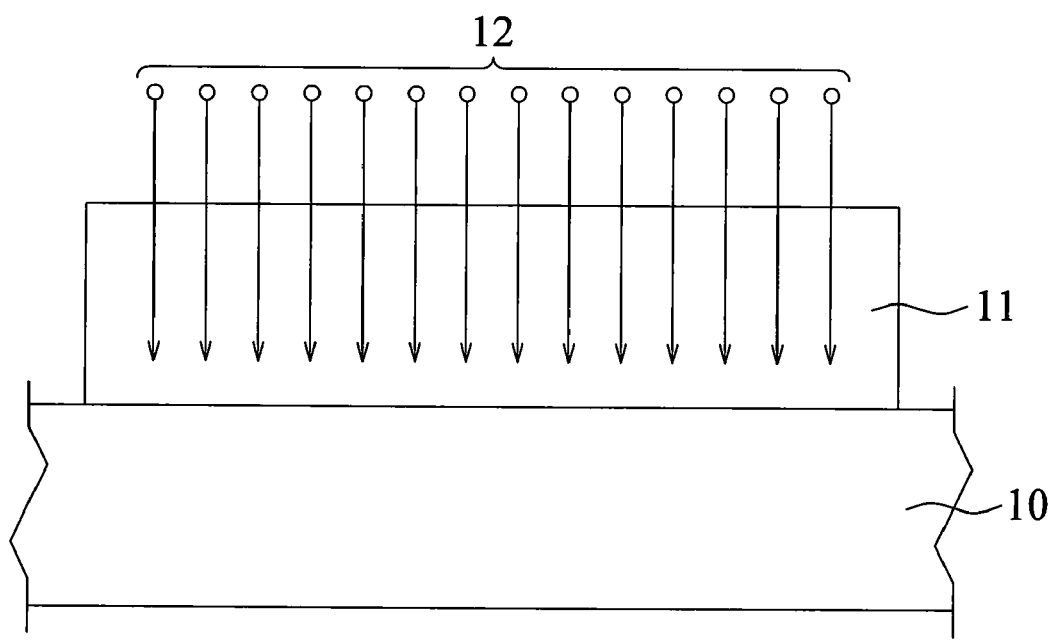
Figure 1E:
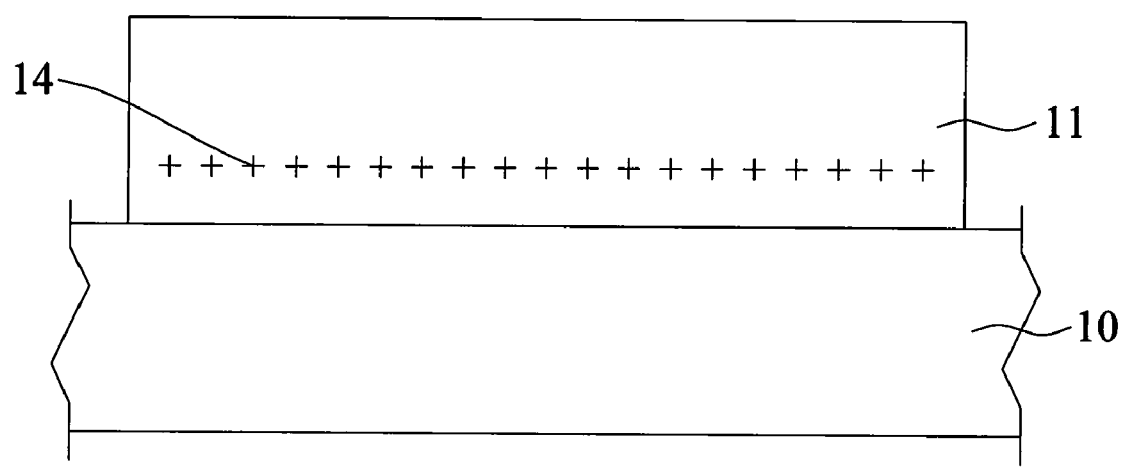

Besides, as the example shown in FIG. 1D and FIG. 1E, by using implantation to implant B atoms 12 into MA layer 11, it is possible that the A vacancies 14 are located only in a specific portion of the MA layer 11 which is decided by the practical recipe of the implantation. For example, by using mask so let portion of the MA layer 11 is not implanted or by adjusting the implanting energy of the implanted B atoms 12 so let the A vacancies 14 are only appeared on some specific depths, as shown in FIG. 1E. Therefore, it is possible to precisely and flexible adjust the memristance of different portions of the MA layer 11, i.e., to precisely and flexibly adjust the memristance of a film both non-depleted portion and depleted portions which the A vacancies 14 (such as oxygen vacancies) are located.

Figure 2A:
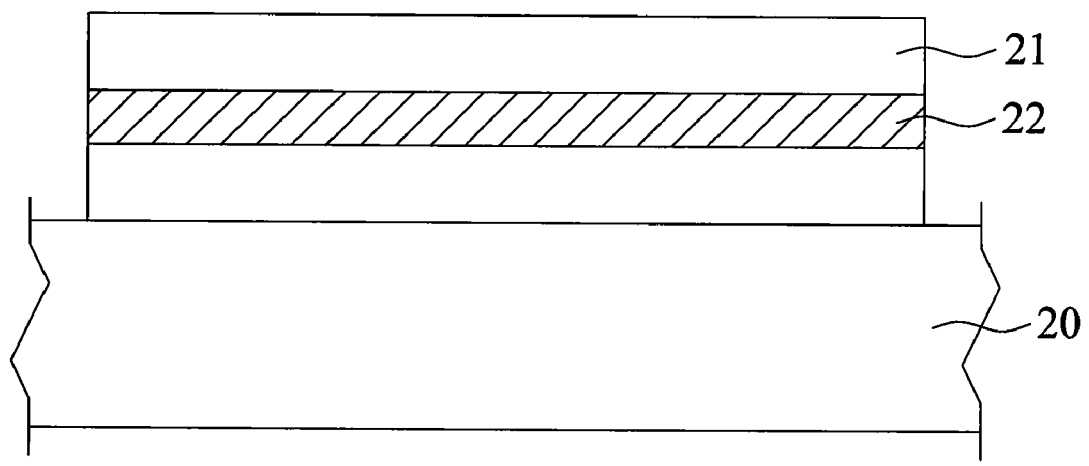
FIG. 2A to FIG. 2D are cross-sectional views illustrating a method for forming an electrode structure with memristance using implantation according to another embodiment.
Figure 2B:
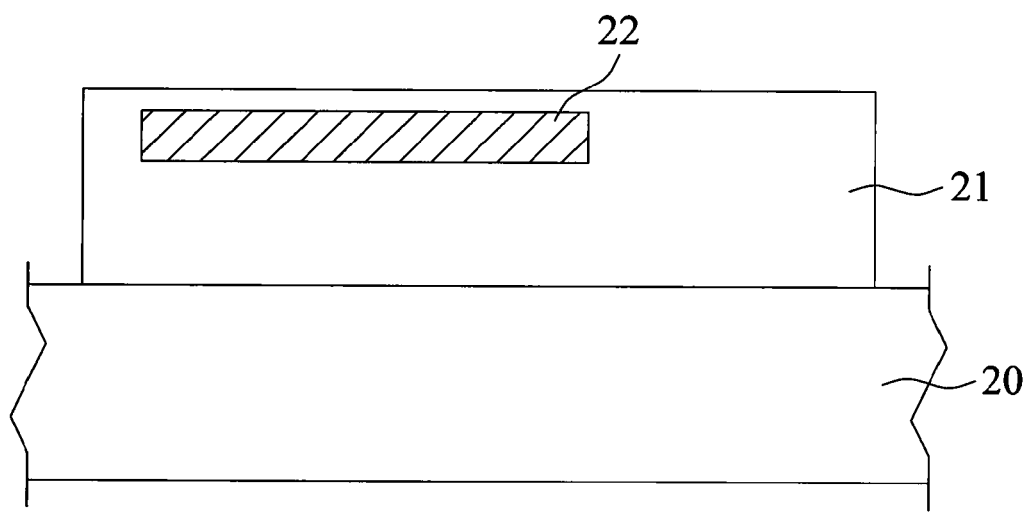
Figure 2C:
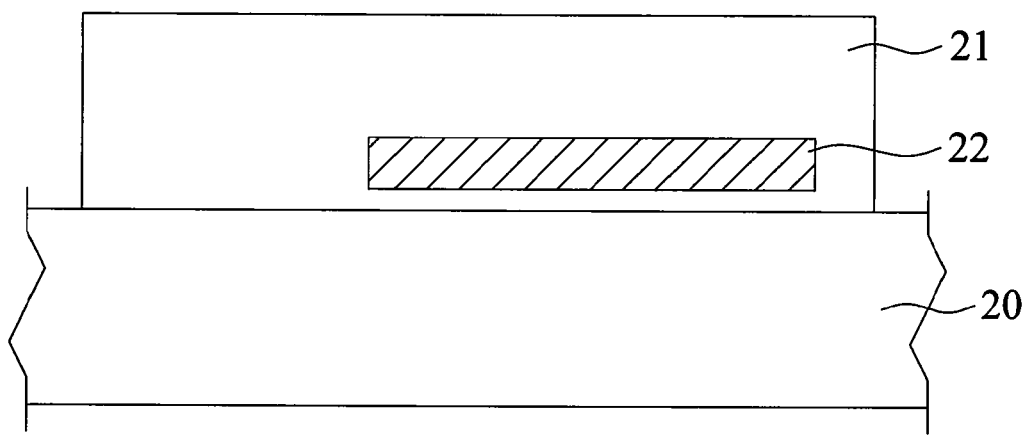
Figure 2D:
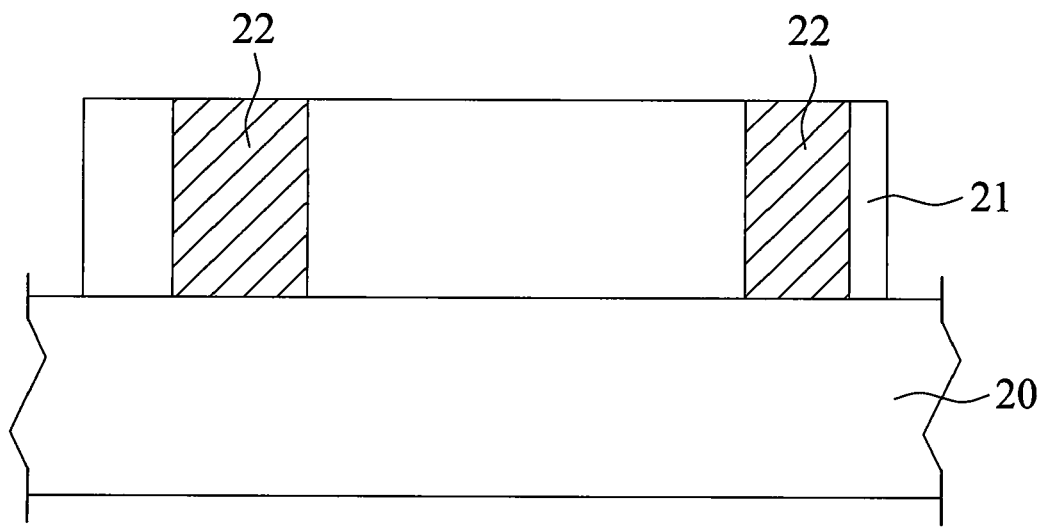

For example, as shown in FIG. 2A, the memristance of the memristor is symmetric, because the depleted portion 22 is located on the middle of the memristor 21 on a substrate 20. Moreover, as discussed above, the memristor enters hysteresis when all vacancies arrive a side of the memristor so there are no free charge carriers inside the memristor. Hence, as shown in FIG. 2B and FIG. 2C, the memristance of the memristor 21 is asymmetric, because the depleted portion 22 is located close to one side (different sides) of the memristor 21. Moreover, by using the mask, it is possible that the depleted region 22 only overlapped with a portion of the memristor 21, as shown in FIG. 2C. Furthermore, when there are at least two depleted portions 22, they also can be horizontally arranged as shown in FIG. 2D. In other words, when the memristor 21 is located on the substrate 20, the current direction through the memristor 21 can be arranged vertical (as shown in FIG. 2A-2C), horizontal (as shown in FIG. 2D) or a combination of vertical and horizontal (not shown, such as oblique or a combination of several vertical/horizontal/oblique) arrangements. In this case, by the possible arrangement of the depleted portions, more possible applications of the memristor 21 can be achieved.

Without question, only implantation can provide the elasticity shown in FIGS. 2A-2D. For these conventional manufacture methods, the vacancies, corresponds to the depleted region(s), are formed during the formation of the MA layer. Hence, it is essentially impossible to form them in the depleted region(s) only on specific portions of the MA layer, regardless of being vertically arranged or horizontally arranged.

The second embodiment of the present invention is a method for forming a memristor material by using ion implantation.

Figure 3A:
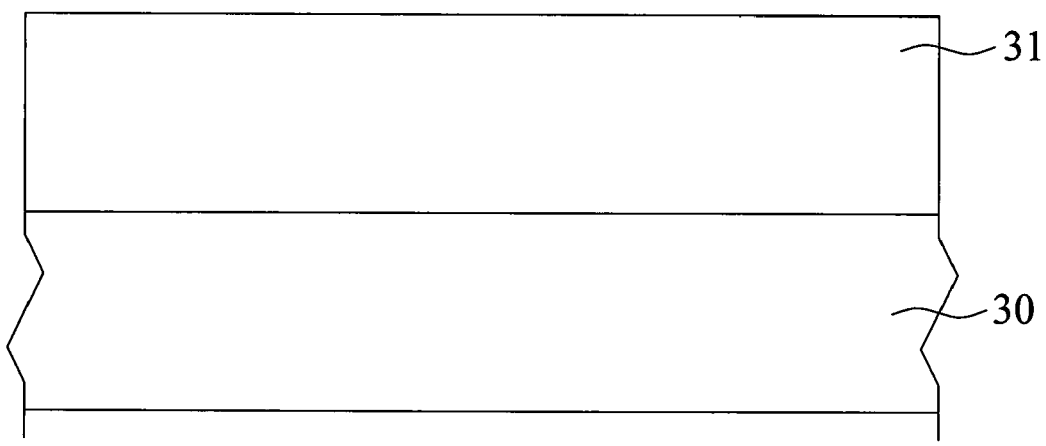
FIG. 3A to FIG. 3C are cross-sectional views illustrating a method for forming an electrode structure with memristance using implantation according to the another embodiment.
Figure 3B:
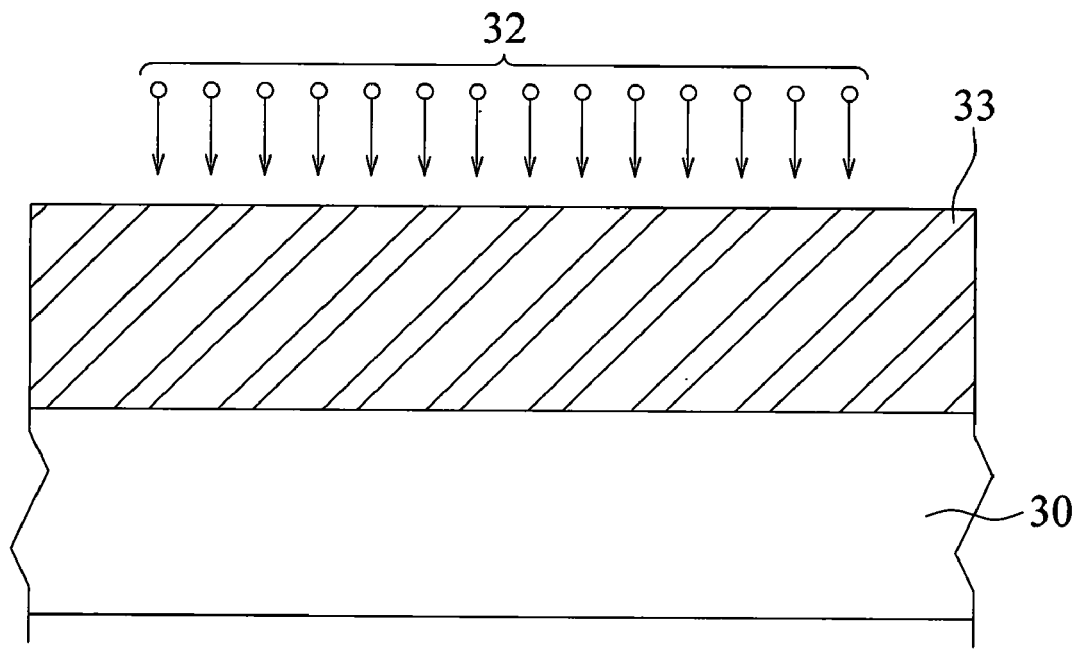
Figure 3C:
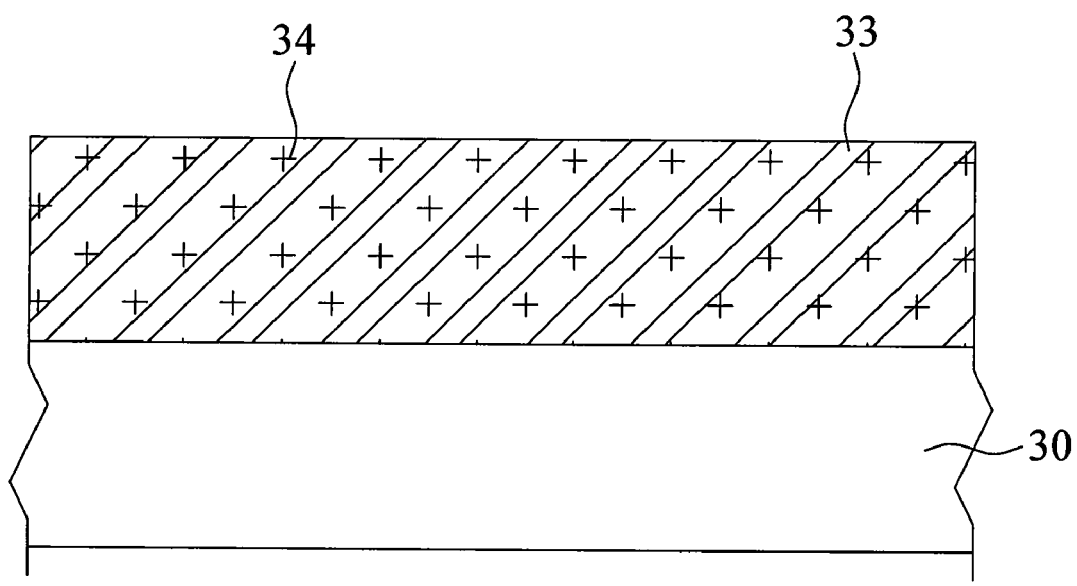

First, as shown in FIG. 3A, provide a substrate 30 with an M layer 31 formed on the substrate 30. Herein, M is an element selected from a group consisting of the at least following: transition metal and non-metal. Moreover, how to form the M layer 31 is not limited, it can be formed by PVD, CVD, sputtering, and so on.

Second, implant numerous A atoms 32 into the M layer 31 so as to allow the M layer 31 be transformed into a MA layer 33, wherein A is an electron-rich element.

Third, heat the MA layer 33 so expel at least a portion of the A atoms 32 away from the MA layer 33 and then numerous A vacancies 34 are formed inside the MA layer 33. Herein, it is possible that at least a portion of implanted A atoms are transformed into numerous $A\_2$ molecules and out gassed, such that numerous A vacancies 34 are formed. It also is possible that the number of the implanted A atoms 32 is less than the number of A atoms of the MA layer 33, such that some M atoms are not bonded with A atoms (even other M atoms) and then the A vacancies 34 are formed.

Significantly, there are one main difference between the second embodiment and the first embodiments. For the first embodiment, the MA layer is formed before the implantation of B atoms for inducing A vacancies. But, in the second embodiment, the implantation of A atoms is used to form the MA layer, even to induce the formation of A vacancies during the following heat process. Moreover, the formation of the M layer by the conventional methods will essentially be more effective than the formation of the MA layer by the conventional methods, because the required reaction is simpler. Hence, it may be a useful method to form a better quality memristor.

Except the above main difference, the two embodiments can have some potential variations on at least the below: what is the A atom, the recipes of implantation process of A atom, how to expel molecule with A to induce A vacancies, the distribution of depleted region(s) inside the MA layer, the relationship between the timing of forming MA and the timing of expelling A atom/molecule from MA layer, and so on. Hence, the similar discussions are omitted in this embodiment.

In short, the second embodiment is proposed to at least emphasize the application of implantation on formation of the memristor.

Note that the mechanism of the second embodiment can be briefly divided into two stages: (1) Forming a MA layer with proper M-A ratio, i.e., each M atom is fully bonded with neighboring M atom(s) and/or A atom(s). (2) Expelling some A atoms (or molecules with A, such as $A\_2$ molecule), such that some M atoms are not fully bonded with neighboring M atoms(s) and/or A atoms(s). Herein, owing to only some A atoms are expelled, these un-bounded chemical bonds will form some A vacancies. Of course, as usual, the expelled portion of A atoms shall be less than 50%.

Hence, another embodiment of the present invention is a method for forming a memristor material by using ion implantation.

Figure 4A:
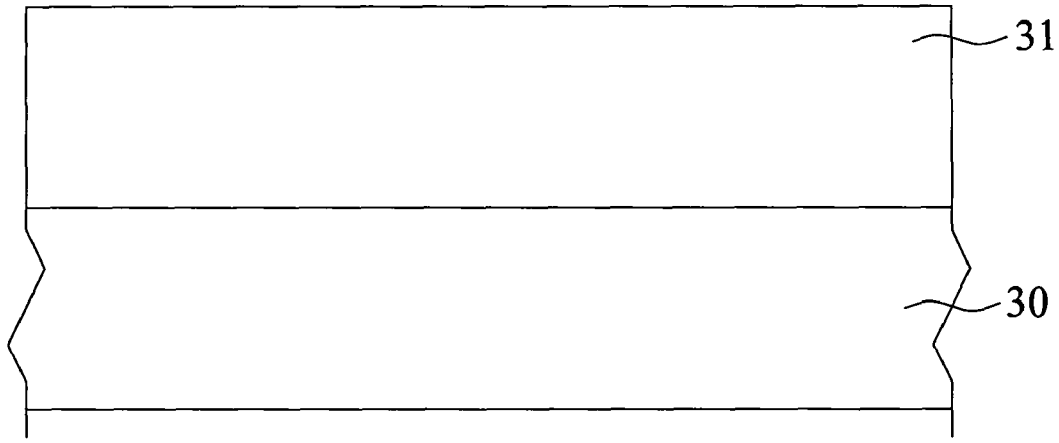
FIG. 4A to FIG. 4B are cross-sectional views illustrating a method for forming an electrode structure with memristance using implantation according to one further embodiment.

First, as shown in FIG. 4A, a substrate 30 having an M layer 31 formed thereon is provided. Herein, M is an element selected from a group consisting of the at least following: transition metal and non-metal. Moreover, how to form the M layer 31 is not limited, it can be formed by PVD, CVD, sputtering, and so on.

Figure 4B:
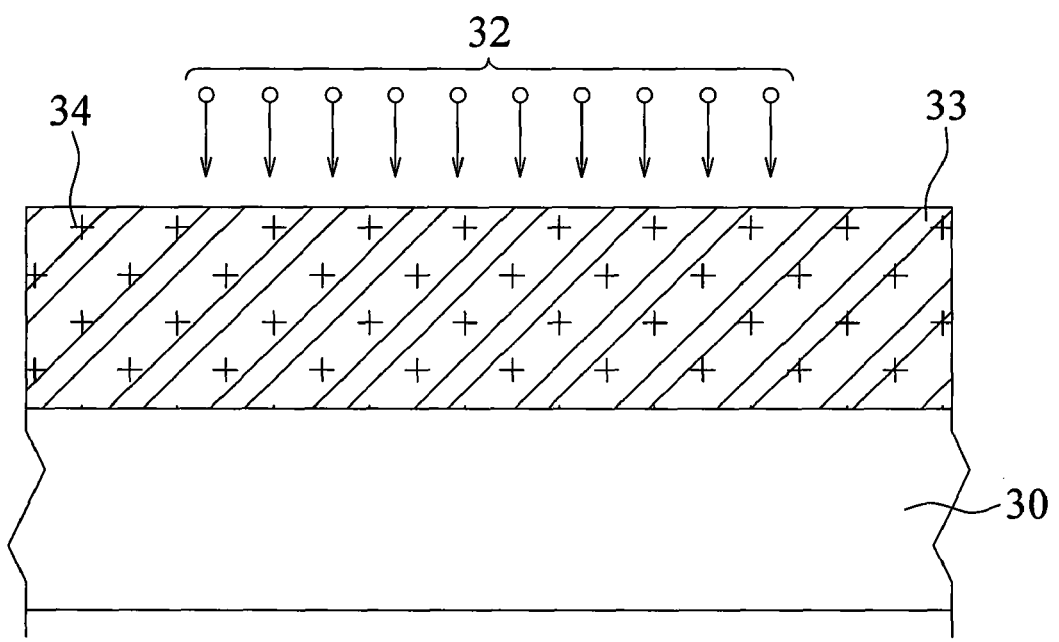
Figure 5:
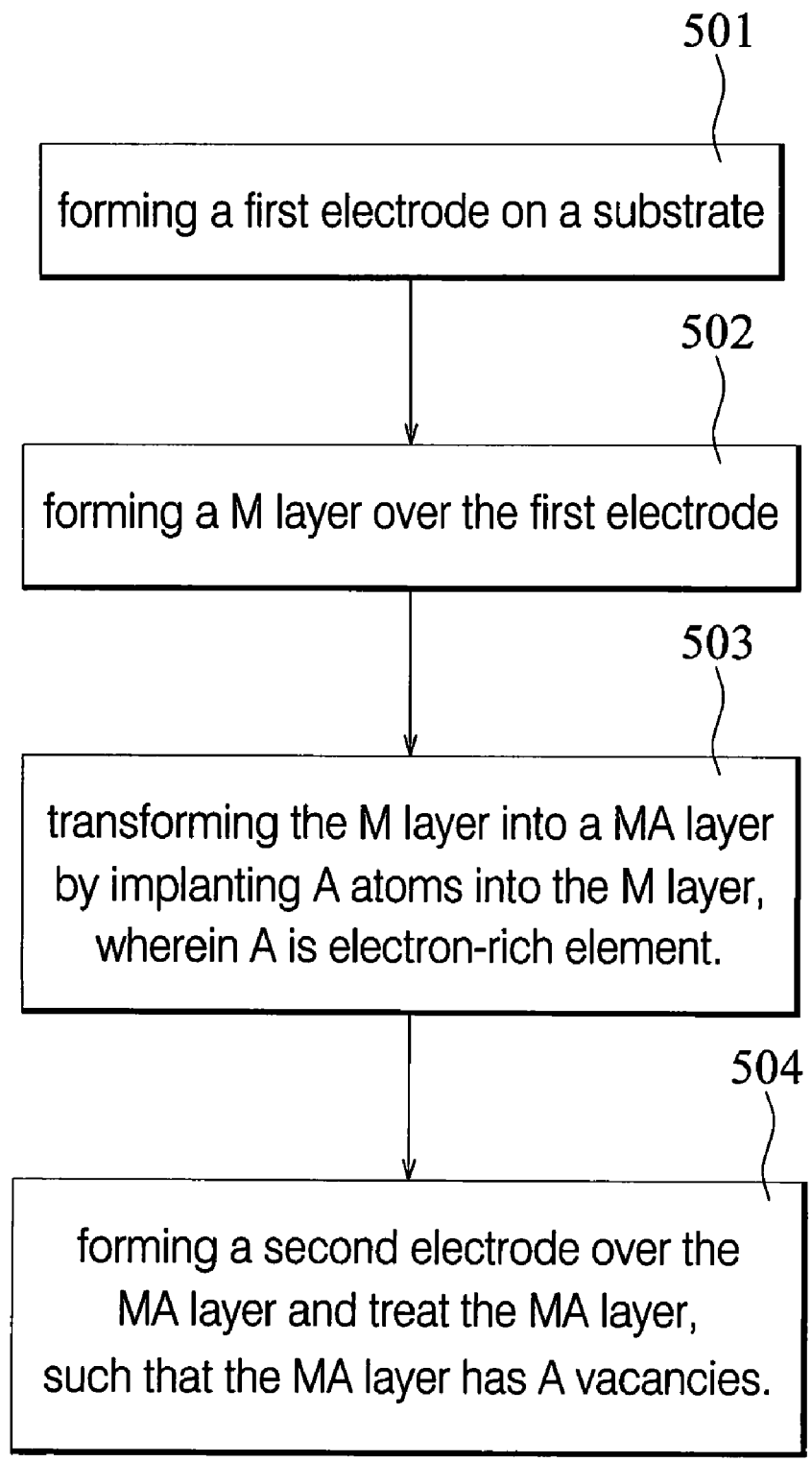
FIG. 5 is a flow chart of a method for forming an electrode structure with memristance using implantation according to a next embodiment.

Second, as shown in FIG. 4B, numerous A atoms 32 are implanted into the M layer 31 so as to transform the M layer 31 into a MA layer 33 with some A vacancies 34 inside the MA layer 33, wherein A is an electron-rich element.

Clearly, the mechanism of the embodiment can be briefly divided into two stages: (1) Providing an M layer, wherein each M atom is only bonded with other M atoms. (2) Adding numerous A atoms into the M layer, such that most of M atoms are fully bonded with neighboring A and/or M atoms but some of M atoms are not fully bonded with neighboring A and/or M atoms.

Again, except different steps for forming the MA layer with A vacancies, as the two above embodiments, the embodiment can have some potential variations on at least the following: what is the A atom, the recipes of implantation process of A atom, how to expel A atom and/or molecule with A to induce A vacancies, the distribution of depleted region(s) inside the MA layer, and so on. Hence, the similar discussions are omitted in this embodiment.

A further embodiment is an application of the memristor (or the memristor material) formed by the above embodiments. The embodiment is a method of forming electrode structure with memristance by implantation.

First, as shown in step 501, a first electrode is formed on a substrate.

Second, as shown in step 502, an M layer is formed over the first electrode. Herein, M is an element selected from a group consisting of the at least following: transition metal and non-metal.

Third, as shown in step 503, the M layer is transformed into a MA layer by implanting numerous A atoms into the M layer. Herein, A is an electron-rich element.

Finally, as shown in step 504, a second electrode is formed over the MA layer and treat the MA layer, such that the MA layer has a plurality of A vacancies.

Similarly, except different steps for forming the first electrode and the second electrode, as the embodiments as discussed above, the embodiment can have some potential variations about the MA layer with A vacancies on at least the following: what is the A atom, the recipes of implantation process of A atom, how to expel A atoms and/or molecules with A to induce A vacancies, the distribution of depleted region(s) inside the MA layer, and so on. Hence, the similar discussions are omitted in this embodiment.

Furthermore, the first electrode usually is formed of a metal or a metal oxide that forms a Schottky contact with the MA layer. And the second electrode is usually formed of a metal or a metal oxide that forms an Ohmic contact with the MA layer. As an example, if the MA layer is n-type, the first electrode may be formed of a material having a relatively high work function, such as platinum, ruthenium, iridium, iridium oxide or the like. As an example, if the MA layer is p-type, the first electrode may be formed of a material having a lower work function, such as titanium or sliver. As example, the second electrode may be formed of platinum, ruthenium, iridium, iridium oxide or the like.

Note that one aspect of the embodiment is the relation between the timing of forming the second electrode and the timing of treating the MA layer. As usual, to more effectively expel the A atoms, the MA layer usually is treated before the formation of the second electrode. Moreover, the treating step can directly heat the MA layer, also can implant numerous B atoms into the MA layer for forming some volatile AB molecules before the AB molecules are expelled to induce A vacancies inside the MA layer.

It is understood that several modifications, changes, and substitutions are intended in the foregoing disclosure and in some instances some features of the invention will be employed without a corresponding use of other features. Accordingly, it is appropriate that the appended claims be construed broadly and in a manner consistent with the scope of the invention.

The invention claimed is:

1. A method for forming a memristor material by using ion implantation, comprising:
   providing a substrate having a MA layer formed thereon, wherein A is an electron-rich element and M is an element selected from a group consisting of transition metal and non-metal;
   implanting a plurality of B components into said MA layer; and
   treating said MA layer, such that at least a portion of AB components formed by a chemical reaction between said A and said B are expelled away from said MA layer and then a plurality of A vacancies are distributed inside said MA layer.

2. The method as claimed in claim 1, wherein said MA layer is formed by implanting a plurality of A components into an M layer formed on said substrate.

3. The method as claimed in claim 1, wherein said electron-rich element is selected from a group consisting of oxygen, sulfur, fluorine, chlorine, bromine, and iodine.

4. The method as claimed in claim 1, wherein said M is selected from a group consisting of Titanium, Tantalum, Calcium, Nickel, Cerium, Vanadium, Niobium, Tungsten, Zirconium, Indium, Zinc, Tin, Platinum, ruthenium, Iridium, Silver and other transition metal.

5. The method as claimed in claim 1, wherein said non-metal is selected from a group consisting of carbon and silicon.

6. The method as claimed in claim 1, wherein said B is selected from a group consisting of said Hydrogen, and any element chemical reactive with said A to form volatile said AB.

7. The method as claimed in claim 1, wherein said treating step is selected from a group consisting of heating, annealing, hot gas heating, and light projecting.

8. The method as claimed in claim 1, wherein when there are at least two depleted regions having said A vacancies inside said MA layers, each said depleted region only partially overlapped with said MA layer and an arrangement direction of said depleted regions is selected from a group consisting of vertical direction, horizontal direction and combination thereof.

9. A method for forming a memristor material by using ion implantation, comprising:
   providing a substrate having a M layer formed thereon, wherein said M is an element selected from a group consisting of transition metal and non-metal; and
   implanting numerous A components into said M layer so as to transform said M layer into a MA layer with numerous A vacancies inside said MA layer, wherein said A is an electron-rich element.

10. The method as claimed in claim 9, wherein at least a portion of implanted A components are transformed into A_2 components and out gassed said M layer during said implanting step.

11. The method as claimed in claim 9, wherein said electron-rich element is selected from a group consisting of oxygen, sulfur, fluorine, chlorine, bromine, and iodine.

12. The method as claimed in claim 9, said M is selected from a group consisting of Titanium, Tantalum, Calcium, Nickel, Cerium, Vanadium, Niobium, Tungsten, Zirconium, Indium, Zinc, Tin, Platinum, ruthenium, Iridium, Silver and other transition metal.

13. The method as claimed in claim 9, wherein said non-metal is selected from a group consisting of carbon and silicon.

14. The method as claimed in claim 9, wherein when there are at least two depleted regions having said A vacancies inside said MA layers, each said depleted region only partially overlapped with said MA layer and an arrangement direction of said depleted regions is selected from a group consisting of the following: vertical direction, horizontal direction and combination thereof.

15. A method for forming an electrode structure with memristance by implantation, comprising:
   forming a first electrode on a substrate;
   forming an M layer over said first electrode, wherein M is an element selected from a group consisting of transition metal and non-metal;
   translating said M layer into a MA layer by implanting a plurality of A components into said M layer, herein said A is an electron-rich element; and
   forming a second electrode over said MA layer and treating said MA layer, such that said MA layer has a plurality of A vacancies.

16. The method as claimed in claim 15, wherein said M is selected from a group consisting of Titanium, Tantalum, Calcium, Nickel, Cerium, Vanadium, Niobium, Tungsten, Zirconium, Indium, Zinc, Tin, Platinum, ruthenium, Iridium, Silver and other transition metal.

17. The method as claimed in claim 15, wherein said electron-rich element is selected from a group consisting of the following: oxygen, sulfur, fluorine, chlorine, bromine, and iodine.

18. The method as claimed in claim 15, wherein said treating step comprises:
   directly heating said MA layer; and
   implanting a plurality of B components into said MA layer for forming a plurality of volatile AB components before said AB components are expelled to induce a plurality of A vacancies inside said MA layer.

19. The method as claimed in claim 15, wherein said first electrode is formed of a metal or a metal oxide that forms a schottky contact with said MA layer, and said second electrode is formed of a metal or a metal oxide that forms an ohmic contact with said MA layer.

20. The method as claimed in claim 15, wherein said first electrode is formed of a material having a relatively high work function when said MA layer is n-type, said first electrode may be formed of a material having a lower work function when said MA layer is p-type, and said second electrode is formed of platinum, ruthenium, iridium, or iridium oxide.

* * * * *